Figure 1:
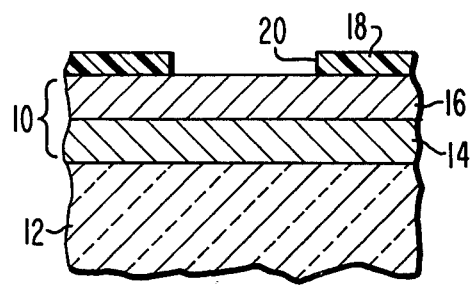

United States Patent [19]

Goel

[11] 4,194,285
[45] Mar. 25, 1980

[54] METHOD OF MAKING A FIELD EFFECT TRANSISTOR

[75] Inventor: Jitendra Goel, Kendall Park, N.J.

[73] Assignee: RCA Corporation, New York, N.Y.

[21] Appl. No.: 915,653

[22] Filed: Jun. 15, 1978

[51] Int. Cl.$^2$ .............................................. B01J 17/00
[52] U.S. Cl. ........................................ 29/579; 29/580; 29/589; 427/88; 427/84; 357/15; 430/319
[58] Field of Search ................... 29/580, 578, 579, 589, 29/571; 96/27 E, 36.2; 427/88, 89, 84

[56] References Cited

U.S. PATENT DOCUMENTS

| | | | |
|---|---|---|---|
| 3,920,861 | 11/1975 | Dean | 427/88 |
| 3,951,708 | 4/1976 | Dean | 427/89 |
| 4,086,694 | 5/1978 | San | 96/36.2 |

*Primary Examiner*—W. C. Tupman
*Attorney, Agent, or Firm*—H. Christoffersen; D. S. Cohen

[57] ABSTRACT

A field effect transistor having a gate on the bottom of a groove in a body of semiconductor material with the source and drain being on a surface at opposite sides of the groove is made by first forming a recess in the surface of the semiconductor body. A metal layer is then coated on the surface of the semiconductor body and on the surfaces of the recess. A layer of a photoresist is then coated over the metal layer. The photoresist is then exposed to a beam of light whose rays extend along a path which is at a very small angle with respect to the surface of the semiconductor body to fully expose a narrow portion of the photoresist layer at one edge of the recess. The fully exposed portion of the photoresist layer is removed to expose a narrow area of the metal layer along the edge of the recess. The exposed portion of the metal layer is then removed and a groove is formed in the portion of the surface of the semiconductor material exposed by removing a portion of the material layer. A metal film is coated on the bottom of the groove to form the gate of the field effect transistor with the metal layer on the bottom of the recess at one side of the groove and the metal layer on the surface of the semiconductor body at the other side of the groove forming the source and drain of the field effect transistor.

7 Claims, 6 Drawing Figures

METHOD OF MAKING A FIELD EFFECT TRANSISTOR

This present invention relates to a method of making a field effect transistor and particularly to a method of making such a transistor having a very short gate, e.g., submicron in length.

U.S. Pat. No. 3,764,865 to L. S. Napoli et al., issued Oct. 9, 1973, entitled "SEMICONDUCTOR DEVICES HAVING CLOSELY SPACED CONTACT," discloses a field effect transistor having a gate on the bottom surface of a groove in the surface of a body of semiconductor material, and source and drain contacts on the surface of the semiconductor body adjacent opposite sides of the groove. This type of field effect transistor has the edges of the gate contact close to and aligned with the adjacent edges of the source and drain contacts.

For certain type of operations, particularly high frequency operation, it is desired that the field effect transistor have a very short gate length, e.g., submicron in length. By gate length is meant the distance across the gate from the source to the drain. Initially the length of the gate was defined using photolithographic techniques wherein a mask was used to define the length of the gate. However, using such technique it is very difficult, if at all possible, to form masks which will define regions having such submicron short lengths. Therefore, several other techniques have been developed to form short length gates. For example, in U.S. Pat. No. 3,920,861 to R. H. Dean, issued Nov. 18, 1975, entitled "METHOD OF MAKING A SEMICONDUCTOR DEVICE", there is described a controlled etching technique for forming small openings which define the length of the gate. U.S. Pat. No. 3,898,353 to L. S. Napoli et al., issued Aug. 5, 1975, entitled "SELF ALIGNED DRAIN AND GATE FIELD EFFECT TRANSISTOR", and U.S. Pat. No. 3,951,708, to R. H. Dean, issued Apr. 20, 1976, entitled "METHOD OF MANUFACTURING A SEMICONDUCTOR DEVICE", each describe the use of angle evaporation for forming small openings for defining the length of the gate. However, these techniques have the disadvantage of being complex and requiring a great number of steps.

In the drawings:

FIGS. 1–6 are each sectional views illustrating the various steps of the method of the present invention for making a field effect transistor having a short gate.

Referring to FIG. 1, the method of the present invention starts with a body 10 of semiconductor material, such as silicon, gallium arsenide or the like. As shown, the semiconductor body 10 is on a substrate 12 of an insulating or semi-insulating material, such as sapphire, spinel, or semi-insulating gallium arsenide. The semiconductor material body 10 is shown as being made up of a layer 14 of one conductivity type, such as N type, having a second layer 16 thereon of the same conductivity type but a higher concentration of the conductivity modifier, such as N+ type. The layer 14 will serve as the active region of the transistor with the higher conductivity layer 16 forming contact regions for the active layer 14.

Figure 2:
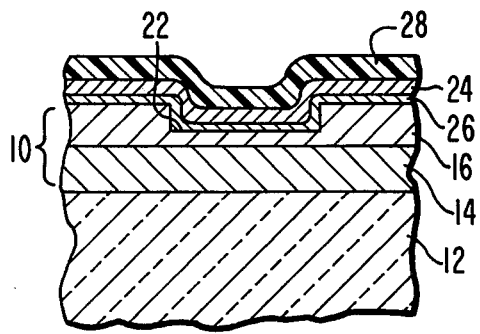

On the surface of the semiconductor body 10 is provided a layer 18 of a photoresist which is defined by standard photolithographic techniques to have an opening 20 therein to expose a portion of the surface of the semiconductor body. As shown in FIG. 2, a shallow recess 22 is provided in the exposed portion of the surface of the semiconductor body 10. The recess 22 may be formed by etching with a suitable etchant or by ion beam milling. The recess 22 should be provided with straight side walls which are substantially perpendicular to the surface of the semiconductor body, which can be readily achieved with ion beam milling. Such straight side walls can also be achieved in N+ gallium arsenide by using an etchant which comprises one part sulfuric acid, one part water and 8 parts $H_2O_2$. The recess 22 is preferably of a depth less than the thickness of the N+ layer 16.

After removing the photoresist layer 18, a layer 24 of a conductive metal such as gold, is coated over the surface of the semiconductor material body 10 and the surfaces of the recess 22. The adherence of the gold layer 24 may be improved by including a layer 26 of titanium between the gold layer 24 and the semiconductor material 10. The metal layers 24 and 26 may be deposited by any well known technique, such as sputtering or vacuum deposition. A positive photoresist layer 28 is then coated over the gold layer 24. As shown in FIG. 2, the photoresist layer 28 has a bend therein along each edge of the recess 22.

Figure 4:
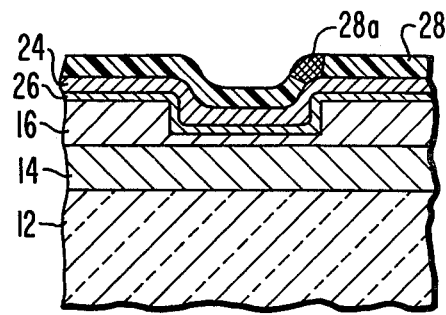
Figure 3:
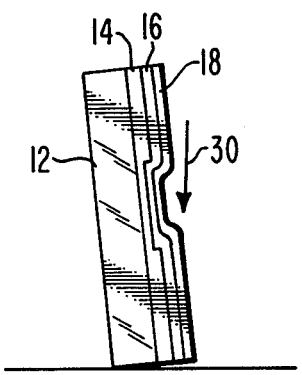

As shown in FIG. 3, the photoresist layer 28 is then exposed to a beam of light, preferably ultraviolet light, with the rays of the light extending along a path which is at a very small angle with respect to the surface of the semiconductor material body 10 as indicated by the arrows 30. Thus, the portion of the photoresist layer 28 which is along the edge of the recess 22 which directly faces the source of the beam of light receives a higher concentration of the light than the remaining portion of the photoresist layer. This results in a narrow strip 28a of the photoresist layer 28 along that edge of the recess 22 in being fully exposed prior to the remainder of the photoresist layer as indicated in FIG. 4. The width of this strip of the photoresist layer 28 which is completely exposed depends on the angle between the beam of light and the surface of the semiconductor material body 10, with the greater the angle the wider the strip. This narrow strip of completely exposed photoresist can then be removed with a suitable developer solvent, such as water, exposing a narrow strip of the gold layer 24.

Figure 5:
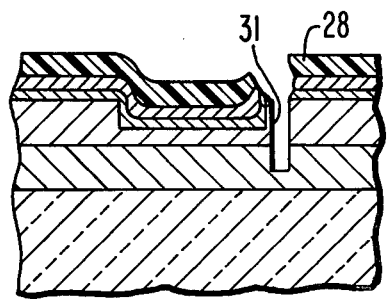

The exposed narrow strip of the gold layer 24 is then removed either by ion beam milling or with a suitable etchant such as a potassium iodide and iodine solution, and the narrow strip of the titanium layer 26 thereunder is also removed either by ion beam milling or with a suitable etchant such as a solution of hydrogen fluoride and hydrogen peroxide. This exposes a narrow strip of the surface of the semiconductor material body 10 which is along the edge of the recess 22. As shown in FIG. 5, a narrow groove 31 is then formed in the exposed surface of the semiconductor material body 10 with the groove 31 extending into the active layer 14. The groove 31 is perferably formed by ion beam milling so that the groove has straight sides. The sides of the groove are preferably contacted with a suitable etchant so as to widen the groove slightly and etch back the sides of the groove under the adjacent metal films.

Figure 6:
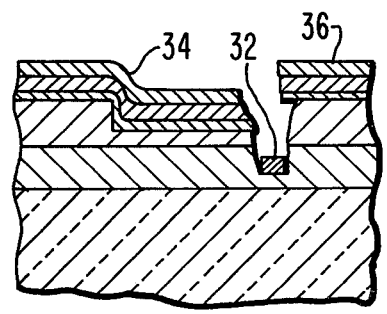

After removing the photoresist layer 28, a metal layer 32 is deposited on the bottom of the groove 31, such as by evaporation in a vacuum or sputtering, as shown in FIG. 6. The metal layer 32 is preferably of a metal which forms a Schottky barrier with the semiconductor material of the active layer 14 so as to form the gate of the field effect transistor. If the semiconductor material is gallium arsenide, the metal layer 32 may be titanium to form the Schottky barrier. At the same time that the metal layer 32 is deposited on the bottom of the groove 30, the same metal will deposit on the portions of the gold layer 24 at each side of the groove 31 to provide contacts 34 and 36. The portions of the metal layers on the second layer 16 at each side of the groove 31 forms the source and drain of the field effect transistor.

Thus, there is provided by the present invention a method of making a field effect transistor in which the length of the gate, i.e., the dimension of the gate between the source and the drain, is controlled by a step of photoresist exposure without the use of a mask. The desired length of the gate is controlled by the angle of the exposure light to the surface of the semiconductor material body. This minimizes the number of masks required to make the device and thereby reduces the cost of making the device.

We claim:

1. A method of making a field effect transistor comprising the steps of:
    (a) forming a recess in the surface of a body of semiconductor material,
    (b) depositing a layer of a metal on said surface of the body and the surface of said recess,
    (c) providing a layer of a photoresist over the metal layer,
    (d) subjecting the photoresist to light whose rays are at a small angle with respect to the surface of the body to so completely expose a narrow strip of the photoresist along an edge of said recess,
    (e) removing the completely exposed strip of the photoresist and the portion of the metal layer exposed thereunder,
    (f) forming a groove in the portion of the semiconductor body exposed by the removal of the portion of the metal layer, and
    (g) depositing a metal layer on the bottom of the groove.

2. The method in accordance with claim 1 in which the recess is formed with at least one side wall being substantially perpendicular to the surface of the body and the strip of photoresist which is completely exposed is along the edge of the recess adjacent said side wall.

3. The method in accordance with claim 1 in which the groove is formed by ion beam milling.

4. The method in accordance with claim 1 in which the metal layer is deposited on the bottom of the groove by evaporating in a vacuum.

5. The method in accordance with claim 4 in which the photoresist layer is removed prior to depositing the metal layer on the bottom of the groove, and at the same time that the metal is deposited on the bottom of the groove the same metal is also deposited on the metal on the surface of the body in the recess.

6. The method in accordance with claim 1 in which the semiconductor body includes a portion of one conductivity type and a second portion along the section of the body of the same conductivity type but higher conductivity, the recess extends only into the second portion and the groove extends at least to said first portion.

7. The method in accordance with claim 6 in which the metal on the surface of the body and the recess forms an ohmic contact with the semiconductor material of the second portion of the body and the metal layer on the bottom of the groove forms a Schottky barrier with the semiconductor material of the first portion of the body.

* * * * *